US010424349B2

United States Patent
Lee

(10) Patent No.: US 10,424,349 B2
(45) Date of Patent: Sep. 24, 2019

(54) SEMICONDUCTOR MEMORY DEVICE, FLAG GENERATING CIRCUIT, AND METHOD OF OUTPUTTING DATA IN A SEMICONDUCTOR DEVICE

(71) Applicant: SK hynix Inc., Icheon-si Gyeonggi-do (KR)

(72) Inventor: Yoo Jong Lee, Yongin-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/706,218

(22) Filed: Sep. 15, 2017

(65) Prior Publication Data

US 2018/0268880 A1 Sep. 20, 2018

(30) Foreign Application Priority Data

Mar. 17, 2017 (KR) ................. 10-2017-0033768

(51) Int. Cl.
*G11C 7/10* (2006.01)
*G11C 7/12* (2006.01)
(52) U.S. Cl.
CPC .......... *G11C 7/1006* (2013.01); *G11C 7/1063* (2013.01); *G11C 7/12* (2013.01)
(58) Field of Classification Search
CPC .................................................. G11C 7/1063
USPC .................................................... 365/189.07
See application file for complete search history.

(56) References Cited

U.S. PATENT DOCUMENTS 9,899,069 B1 * 2/2018 Yang ...................... G11C 7/067

OTHER PUBLICATIONS

LPDDR5 Data Copy Low Power Function, Committee Letter Ballot, Jan. 19, 2017, 4 pages, Committee 42.6, Qualcomm, Arlington, Va., USA.

* cited by examiner

*Primary Examiner* — Son L Mai
(74) *Attorney, Agent, or Firm* — William Park & Associates Ltd.

(57) ABSTRACT

A semiconductor memory device may include a memory circuit including a plurality of memory cells coupled between a plurality of word lines and a plurality of bit lines, and configured to output data from the memory cell coupled to each of the bit lines through a global input/output line; a flag-generating circuit configured to generate a flag signal received with respect to the bit lines. The flag signal may include at least one of a duplicate data flag signal and a data bus inversion flag signal based on number of data having a specific logic level among the data in the memory cell for each of the bit lines that may be provided through the global input/output line in a read operation; and an output circuit configured to output the data based on at least one of the duplicate data flag signal and the data bus is inversion flag signal.

20 Claims, 11 Drawing Sheets

FIG.2A

| DQ | BL0 | BL1 | BL2 | BL3 |
|---|---|---|---|---|
| <0> | 0 | 1 | 0 | 1 |
| <1> | 0 | 1 | 0 | 1 |
| <2> | 0 | 1 | 0 | 1 |
| <3> | 0 | 1 | 0 | 1 |
| <4> | 0 | 1 | 0 | 1 |
| <5> | 0 | 1 | 0 | 1 |
| <6> | 0 | 1 | 0 | 1 |
| <7> | 0 | 1 | 0 | 1 |

FIG.2B

| DQ | BL0 | BL1 | BL2 | BL3 |
|---|---|---|---|---|
| <0> | 0 | 1 | 0 | 1 |
| <1> | 0 | 1 | 1 | 1 |
| <2> | 0 | 0 | 0 | 1 |
| <3> | 0 | 0 | 0 | 0 |
| <4> | 0 | 1 | 0 | 0 |
| <5> | 0 | 1 | 0 | 1 |
| <6> | 0 | 1 | 0 | 1 |
| <7> | 0 | 1 | 0 | 1 |

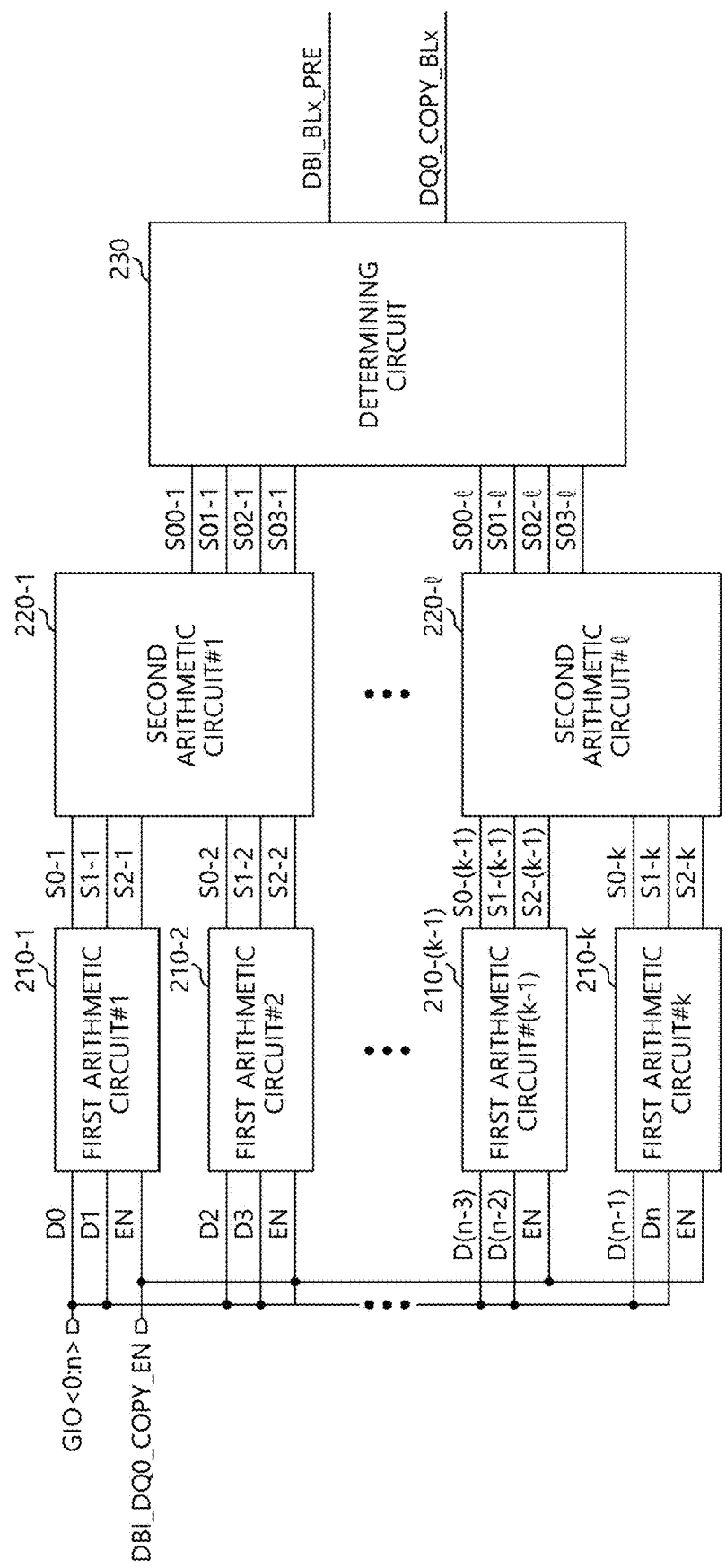

FIG.6A

| FIRST ARITHMETIC CIRCUIT#1 | | | | | |
|---|---|---|---|---|---|
| INPUT | | | OUTPUT | | |
| D1 | D0 | EN | S2_1 | S1_1 | S0_1 |
| Don't care | | 0 | 0 | 0 | 0 |
| 0 | 0 | 1 | 0 | 0 | 1 |
| 0 | 1 | 1 | 0 | 1 | 0 |
| 1 | 0 | 1 | 0 | 1 | 0 |
| 1 | 1 | 1 | 1 | 0 | 0 |

FIG.6B

| SECOND ARITHMETIC CIRCUIT#1 | | | | | | | | | |
|---|---|---|---|---|---|---|---|---|---|
| INPUT | | | | | | OUTPUT | | | |
| S2_2 | S1_2 | S0_2 | S2_1 | S1_1 | S0_1 | S03_1 | S02_1 | S01_1 | S00_1 |
| 0 | 0 | 0 | 0 | 0 | 0 | 0 | 0 | 0 | 0 |
| 0 | 0 | 1 | 0 | 0 | 1 | 0 | 0 | 0 | 1 |
| 0 | 0 | 1 | 0 | 1 | 0 | 0 | 0 | 1 | 0 |
| 0 | 0 | 1 | 1 | 0 | 0 | 0 | 1 | 0 | 0 |
| 0 | 1 | 0 | 0 | 0 | 1 | 0 | 0 | 1 | 0 |
| 0 | 1 | 0 | 0 | 1 | 0 | 0 | 1 | 0 | 0 |
| 0 | 1 | 0 | 1 | 0 | 0 | 0 | 1 | 1 | 0 |
| 1 | 0 | 0 | 0 | 0 | 1 | 0 | 1 | 0 | 0 |
| 1 | 0 | 0 | 0 | 1 | 0 | 0 | 1 | 1 | 0 |
| 1 | 0 | 0 | 1 | 0 | 0 | 1 | 0 | 0 | 0 |

FIG.6C

| DETERMINING CIRCUIT | | | | | | | | | |
|---|---|---|---|---|---|---|---|---|---|
| INPUT | | | | | | | | OUTPUT | |
| S03_1 | S02_1 | S01_1 | S00_1 | S03_2 | S02_2 | S01_2 | S00_2 | DBI_BL0_PRE | DQ0_COPY_BL0 |
| 0 | 0 | 0 | 0 | 0 | 0 | 0 | 0 | 0 | 0 |
| 0 | 0 | 0 | 1 | 0 | 0 | 0 | 1 | 0 | 1 |
| 0 | 0 | 0 | 1 | 0 | 0 | 1 | 0 | 0 | 0 |
| 0 | 0 | 0 | 1 | 0 | 1 | 0 | 0 | 0 | 0 |
| 0 | 0 | 0 | 1 | 0 | 1 | 1 | 0 | 0 | 0 |
| 0 | 0 | 0 | 1 | 1 | 0 | 0 | 0 | 0 | 0 |
| 0 | 0 | 1 | 0 | 0 | 0 | 0 | 1 | 0 | 0 |
| 0 | 0 | 1 | 0 | 0 | 0 | 1 | 0 | 0 | 0 |
| 0 | 0 | 1 | 0 | 0 | 1 | 0 | 0 | 0 | 0 |
| 0 | 0 | 1 | 0 | 0 | 1 | 1 | 0 | 0 | 0 |
| 0 | 0 | 1 | 0 | 1 | 0 | 0 | 0 | 1 | 0 |
| 0 | 1 | 0 | 0 | 0 | 0 | 0 | 1 | 0 | 0 |
| 0 | 1 | 0 | 0 | 0 | 0 | 1 | 0 | 0 | 0 |
| 0 | 1 | 0 | 0 | 0 | 1 | 0 | 0 | 0 | 0 |
| 0 | 1 | 0 | 0 | 0 | 1 | 1 | 0 | 1 | 0 |
| 0 | 1 | 0 | 0 | 1 | 0 | 0 | 0 | 1 | 0 |
| 0 | 1 | 1 | 0 | 0 | 0 | 0 | 1 | 0 | 0 |
| 0 | 1 | 1 | 0 | 0 | 0 | 1 | 0 | 0 | 0 |
| 0 | 1 | 1 | 0 | 0 | 1 | 0 | 0 | 1 | 0 |
| 0 | 1 | 1 | 0 | 0 | 1 | 1 | 0 | 1 | 0 |
| 0 | 1 | 1 | 0 | 1 | 0 | 0 | 0 | 1 | 0 |
| 1 | 0 | 0 | 0 | 0 | 0 | 0 | 1 | 0 | 0 |
| 1 | 0 | 0 | 0 | 0 | 0 | 1 | 0 | 1 | 0 |
| 1 | 0 | 0 | 0 | 0 | 1 | 0 | 0 | 1 | 0 |
| 1 | 0 | 0 | 0 | 0 | 1 | 1 | 0 | 1 | 0 |
| 1 | 0 | 0 | 0 | 1 | 0 | 0 | 0 | 1 | 1 |

SEMICONDUCTOR MEMORY DEVICE, FLAG GENERATING CIRCUIT, AND METHOD OF OUTPUTTING DATA IN A SEMICONDUCTOR DEVICE

CROSS-REFERENCES TO RELATED APPLICATION

The present application claims priority under 35 U.S.C. § 119(a) to Korean application number 10-2017-0033768, filed on Mar. 17, 2017, in the Korean Intellectual Property Office, which is incorporated herein by reference in its entirety.

BACKGROUND

1. Technical Field

Various embodiments may generally relate to a semiconductor device, more particularly to a semiconductor device, a flag generating circuit and a method of outputting data.

2. Related Art

A performance of a semiconductor memory device may be determined by various factors. One of the various factors may be a data-processing speed.

Particularly, a performance of a main memory or a graphic memory is mainly dependent upon the data-processing speed of the semiconductor memory device.

Recently, as mobile devices are being diversified and generalized, it may be required to provide the semiconductor memory device applied to the mobile device with low power consumption and high operational speeds.

Thus, it may be required to rapidly process data using minimal resources in the semiconductor memory device.

SUMMARY

In an embodiment, a semiconductor memory device may be provided. The semiconductor memory device may include a memory circuit. The semiconductor memory device may include a flag-generating circuit. The semiconductor memory device may include an output circuit. The memory circuit may include a plurality of memory cells coupled between a plurality of word lines and a plurality of bit lines. The memory circuit may be configured to output data in the memory cell coupled to each of the bit lines through a global input and output (input/output) line. The flag-generating circuit may be configured to generate a flag signal received with respect to the bit lines. The flag signal may include at least one of a duplicate data flag signal and a data bus inversion flag signal based on number of data having a specific logic level among the data in the memory cell for each of the bit lines that may be provided through the global input/output line in a read operation. The output circuit may be configured to output the data in the memory cell provided through the global input/output line in response to at least one of the duplicate data flag signal and the data bus inversion flag signal.

In an embodiment, a circuit for generating a flag signal may be provided. The circuit may include a preliminary flag-generating circuit. The circuit may include a flag-generating circuit. The preliminary flag-generating circuit may be configured to receive data from a memory cell through bit lines provided through a global input/output line. The preliminary flag-generating circuit may be configured to generate a preliminary flag signal by the bit lines by adding the data from the memory cell based on a duplicate data output enablement signal and a data bus inversion enablement signal. The flag-generating circuit may be driven based on the duplicate data output enablement signal and the data bus inversion enablement signal. The flag-generating circuit may be configured to generate the flag signal for each of the bit lines including at least one of a duplicate data flag signal and a data bus inversion flag signal from the preliminary flag signal for each of the bit lines.

In an embodiment, a method of outputting data in a semiconductor memory device may be provided. The semiconductor memory device may include a memory circuit including a plurality of memory cells coupled between a plurality of word lines and a plurality of bit lines. The memory circuit may be configured to output data in the memory cell coupled to each of the bit lines through a global input/output line. A flag signal by the bit lines may be generated based on number of data having a specific logic level among the data in the memory cell by the bit lines provided through the global input/output line. The flag signal may include at least one of a duplicate data flag signal and a data bus inversion flag signal. The data in the memory cell provided through the global input/output line may be outputted based on at least one of the duplicate data flag signal and the data bus inversion flag signal.

BRIEF DESCRIPTION OF THE DRAWINGS

FIGS. 2A, 2B, 3A and 3B are block diagrams illustrating a function for outputting duplicate data in accordance with various examples of embodiments

FIG. 5 is a block diagram illustrating a preliminary signal-generating circuit in accordance with various examples of embodiment.

FIGS. 6A to 6C are block diagrams illustrating operations of a preliminary flag-generating circuit in accordance with various examples of embodiments.

DETAILED DESCRIPTION

Hereinafter, examples of embodiments will be described below with reference to the accompanying drawings through various examples of the embodiments.

Figure 1:
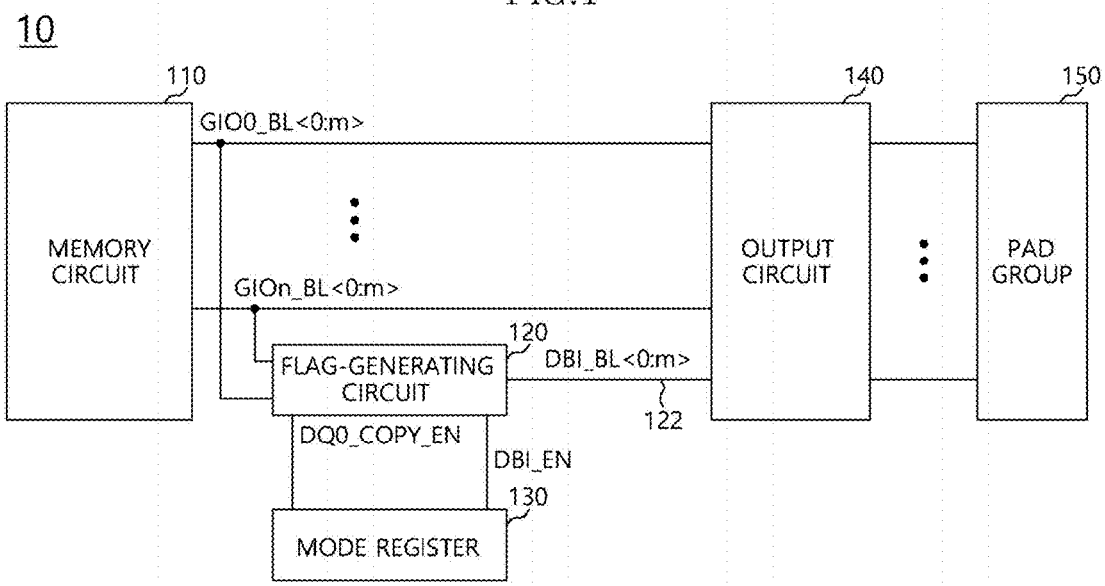
FIG. 1 is a block diagram illustrating a semiconductor memory device in accordance with various examples of embodiments.

FIG. 1 is a block diagram illustrating a semiconductor memory device in accordance with various examples of embodiments.

Referring to FIG. 1, a semiconductor memory device 10 in an embodiment may include a memory circuit 110, a flag-generating circuit 120, a mode register 130, an output circuit 140, and a pad group 150.

The memory circuit 110 may include a plurality of memory cells coupled between a plurality of word lines and a plurality of bit lines. When an address signal is perhaps provided from a controller, data may be written or read by accessing a desired memory cell among the memory cells by an addressing circuit such as a row decoder or a column decoder.

Global input and output (input/output) lines GIO0~GIOn may be connected with the bit lines BL<0:m>, respectively. Data in the memory cells connected to the bit lines may be transmitted to the output circuit 140 through the global input/output lines GIO0-GIOn in response to a read command. The data may be represented by GIO0_BL<0:m>~GIOn_BL<0:m>.

The flag-generating circuit 120 may generate a flag signal DBI_BL<0:m> by the bit line in response to the data GIO0_BL<0:m>~GIOn_BL<0:m>, a data bus inversion (DBI) enablement signal (DBI_EN), and a duplicate data output enablement signal DQO_COPY_EN transmitted through the global input/output lines GIO0~GIOn. The flag signal DBI_BL<0:m> by the bit line may be outputted through a flag transmission line 122.

The flag signal DBI_BL<0:m> from the bit line may include data coding information from the bit line BL<0:m>. The output circuit 140 may output the data in response to the data GIO0_BL<0:m>~GIOn_BL<0:m> transmitted through the global input/output lines GIO0~GIOn and the flag signal DBI_BL<0:m> for each of the bit lines.

In an example of an embodiment, when the DBI enablement signal DBI_EN and the duplicate data output enablement signal DQO_COPY_EN are disabled, the flag-generating circuit 120 may not be operated regardless of a level of the inputted data GIO0_BL<0:m>~GIOn_BL<0:m>. That is, the flag-generating circuit 120 must also be disabled.

In an example of an embodiment, when the DBI enablement signal DBI_EN is enabled and the duplicate data output enablement signal DQO_COPY_EN is disabled, the flag-generating circuit 120 may generate a DBI flag signal with respect to each of the bit lines BL<0:m> as the flag signal DBI_BL<0:m> from the bit line.

In an example of an embodiment, when the DBI enablement signal DBI_EN is disabled and the duplicate data output enablement signal DQO_COPY_EN is enabled, the flag-generating circuit 120 may generate the duplicate data flag signal through at least one among the flag signals DBI_BL<0:m> for each of the bit lines, for example, a flag signal DBI_BL0 with respect to a zeroth bit line. In this case, the rest of bits of the flag signal DBI_BL<0:m> may be disabled.

In an example of an embodiment, when the DBI enablement signal DBI_EN and the duplicate data output enablement signal DQO_COPY_EN are enabled, the flag-generating circuit 120 may generate a first flag signal DBI_BL0 from the duplicate data flag signal through at least one among the flag signals DBI_BL<0:m> from the bit line, for example, a flag signal DBI_BL0 with respect to a zeroth bit line and a second flag signal DBI_BL<1:m> from the DBI flag signal through the rest of bits of the flag signal DBI_BL<0:m> from the bit line.

The mode register 130 may generate the DBI enablement signal DBI_EN and the duplicate data output enablement signal DQO_COPY_EN. The mode register 130 may transmit the DBI enablement signal DBI_EN and the duplicate data output enablement signal DQO_COPY_EN to the flag-generating circuit 120.

The output circuit 140 may output the data in response to the flag signals DBI_BL<0:m> from the bit line and the data GIO0_BL<0:m>~GIOn<0:m> transmitted through the global input/output lines GIO0~GIOn.

The pad group 150 may include a pad group and a pad. The pad group may output the data GIO0_BL<0:m>~GIOn_BL<0:m> provided from the output circuit 140. The pad may output the flag signals DBI_BL<0:m> for each of the bit lines.

Therefore, the DBI flag signal and the duplicate data flag signal may be outputted through the flag signal transmission line 122.

A DBI function may invert or not invert the data to increase is number of an outputted bit among a logic low level (0) and a logic high level (1), i.e., number of a reference data bit. For example, when the number of the outputted data in the logic low level is increased, the data may be inverted and outputted under a condition that a bit number of the logic low level are no more than half of the total bits of the data. In contrast, the data may be outputted without inversion under a condition that the bit number of the logic low level is no less than half of the total bits of the data.

The DBI function may function to rapidly transmit the massive amounts of data. The DBI function may be used for rapidly transmitting the data between a central processing unit and a DRAM device in a package-on-package (POP), a multi-chip package (MCP), or various memory interfaces. Particularly, the DBI function may be used, for example, in a mobile memory application such as low power double data rate (LPDDR).

A duplicate data output function may output data and a duplicate data flag in any one of the memory cells coupled to the bit line when the data in the memory cells coupled to the same bit line have a same logic level. Thus, the duplicate data flag signal may represent whether the data of the bit line in the duplicate data output function is a duplicate or not.

FIGS. 2A, 2B, 3A and 3B are block diagrams illustrating a function for outputting duplicate data in accordance with various examples of embodiments.

FIGS. 2A and 2B may illustrate the function for outputting the duplicate data by the four bit lines in the semiconductor memory device.

Referring to FIG. 2A, a cell data DQ<0:7> in a zeroth bit line BL<0> and a second bit line BL<2> may be about 0. A cell data DQ<0:7> in a first bit line BL<1> and a third bit line BL<3> may be about 1. In this case, the duplicate data flag signal may be enabled to have a first logic level.

Referring to FIG. 2B, the cell data DQ<0:7> in the zeroth bit line BL<0> and the third second bit line BL<3> may be about 0 and about 1, respectively. Different cell data DQ2_BL1, DQ3_BL1 and DQ1_BL2 may be in the first bit line BL<1> and the second bit line BL<2>. In this case, the duplicate data flag signal may be disabled to have a second logic level.

Figure 3A:
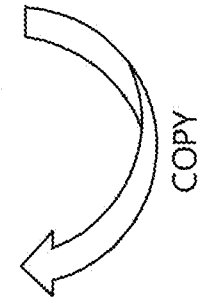

When the duplicated data flag signal is enabled, the semiconductor memory device 10 may output any cell data, for example, DQ<0> with respect to each of the bit lines and the duplicate data flag as illustrated in FIG. 3A. The semiconductor memory device 10 may not output the rest of the cell data DQ<1:7>.

A receiver may copy the cell data, for example, DQ<0> with the rest of the cell data DQ<1:7> in response to the duplicate data flag.

Figure 3B:
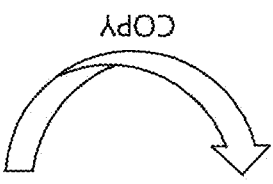

FIG. 3B illustrates the function for outputting the duplicate data with respect to the sixteen bit lines.

As illustrated in FIGS. 3A and 3B, when the duplicated data output function operated in DQ<0:7> is applied, a DQ power may be decreased by about ⅛.

Therefore, when the data of the memory cell connected to the same bit line is substantially the same, an electric power for outputting the data may be remarkably reduced by transmitting a bit of the data.

In an example of an embodiment, when the duplicate data flag signal is transmitted to assist the duplicate data output function, a signal line for transmitting the DBI flag signal, i.e., the flag signal transmission line 122 may be used without an additional signal line.

In an example of an embodiment, when a DBI mode or a duplicate data output mode is not activated (i.e., disablement), the flag signal may not be generated (i.e., disablement). When only the DBI mode is activated, the DBI flag signal by the bit line may be outputted. When only the duplicate data output mode is activated (i.e., enablement), the duplicate data flag signal may be outputted using at least one bit among the flag signals. When the DBI mode and the duplicated data output mode is activated (i.e., enablement), the duplicate data flag signal may be outputted using at least one bit among the flag signal and the DBI flag signal may be outputted using the rest of the bits. The above relations may be represented in a following table.

| DBI enablement signal | Duplicate data output enablement signal | Flag-generating circuit |
| --- | --- | --- |
| Disablement | Disablement | Disablement |
| Enablement | Disablement | Generating the DBI flag signal by the total bit lines |
| Disablement | Enablement | generating the duplicate data flag signal through any one bit among the flag signals disabling the rest of the bits of the flag signals |
| Enablement | Enablement | generating the duplicate data flag signal through any one bit among the flag signals generating the DBI flag signal by the partial bit lines through the rest of the bits of the flag signals. |

Figure 4:
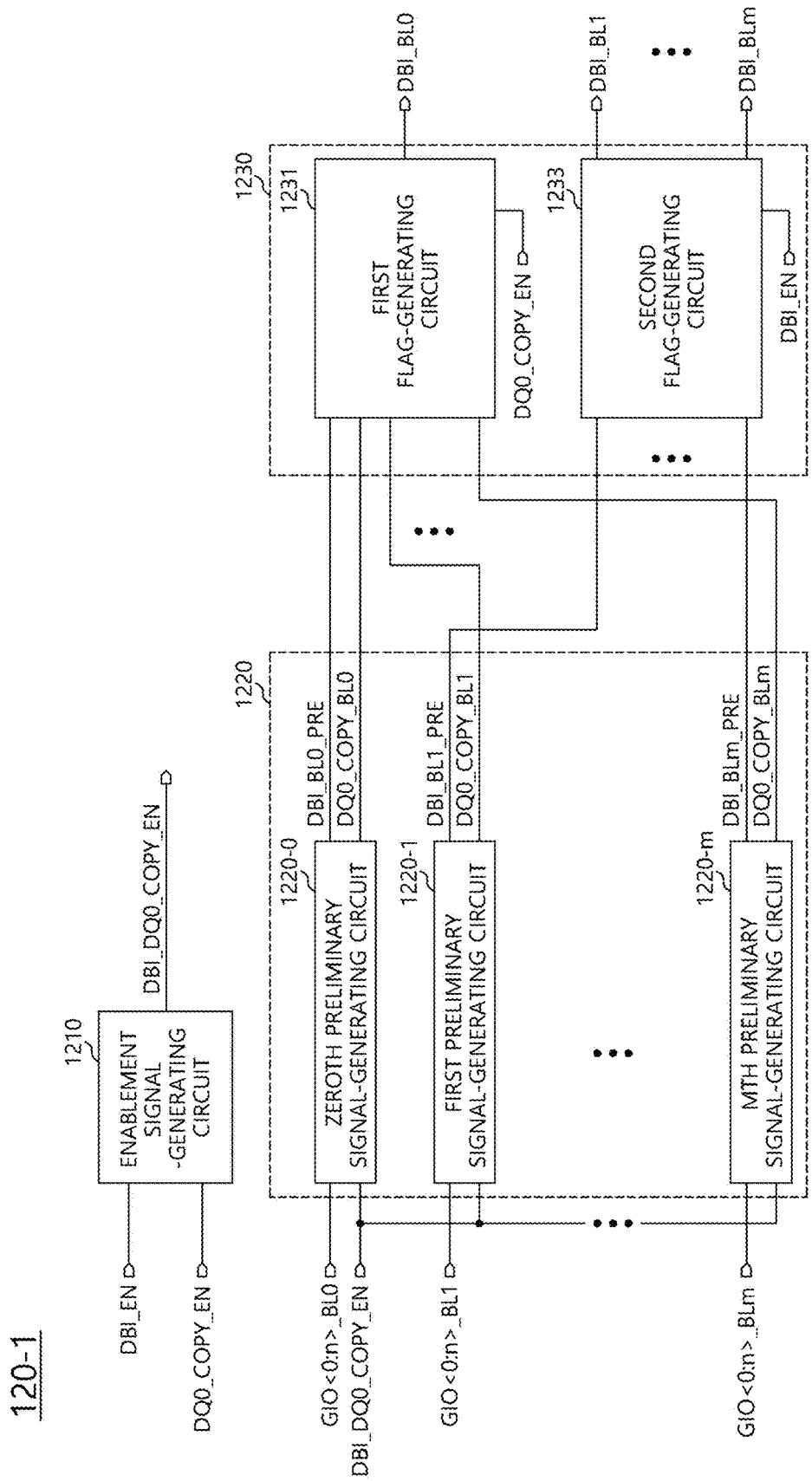
FIG. 4 is a block diagram illustrating a flag-generating circuit in accordance with various examples of embodiments.

FIG. 4 is a block diagram illustrating a flag-generating circuit in accordance with an example of an embodiment.

Referring to FIG. 4, a flag-generating circuit 120-1 may include an enablement signal-generating circuit 1210, a preliminary flag-generating circuit 1220, and a flag-generating circuit 1230.

The enablement signal-generating circuit 1210 may be configured to generate a flag generation-enabling signal DBI_DQO_COPY_EN in response to a DBI-enabling signal BDI_EN and a duplicate data output-enabling signal DQO_COPY_EN provided from the mode register 130.

In an example of an embodiment, when at least one of two logic signals are enabled, the enablement signal-generating circuit 1210 may enable the flag generation-enabling signal DBI_DQO_COPY_EN.

The preliminary flag-generating circuit 1220 may include preliminary signal-generating circuits 1220-0~1220-m coupled to the bit lines BL<0:m>.

Each of the preliminary signal-generating circuits 1220-0~1220-m may generate a preliminary DBI flag signal DBI_BLx_PRE and a preliminary duplicate data flag signal DQO_COPY_BLx in response to data GIO<0:n>_BL0~GIO<0:n>_BLm transmitted through the global input/output lines GIO0~GIOn coupled to the bit lines BL<0:m> and the flag generation-enabling signal DBI_DQO_COPY_EN.

For example, a zeroth preliminary signal-generating circuit 1220-0 may generate a preliminary DBI flag signal DBI_BL0_PRE and a preliminary duplicate data flag signal DQO_COPY_BL0 with respect to a zeroth bit line in response to the data GIO<0:n>_BL0 transmitted through the global input/output lines GIO0~GIOn coupled to the zeroth bit line and the flag generation-enabling signal DBI_DQO_COPY_EN.

The first preliminary signal-generating circuits 1220-1 may generate a preliminary DBI flag signal DBI_BL1_PRE and a preliminary duplicate data flag signal DQO_COPY_BL1 with respect to the first bit line in response to the data GIO<0:n>_BL1 transmitted through the global input/output lines GIO0~GIOn coupled to the first bit line and the flag generation-enabling signal DBI_DQO_COPY_EN.

Similarly, the mth preliminary signal-generating circuits 1220-m may generate a preliminary DBI flag signal DBI_BLm_PRE and a preliminary duplicate data flag signal DQO_COPY_BLm with respect to the mth bit line in response to the data GIO<0:n>_BLm transmitted through the global input/output lines GIO0~GIOn coupled to the mth bit line and the flag generation-enabling signal DBI_DQO_COPY_EN.

In an example of an embodiment, each of the preliminary signal-generating circuits 1220-0~1220-m may generate the preliminary DBI flag signal DBI_BLx_PRE and the preliminary duplicate data flag signal DQO_COPY_BLx among the data GIO<0:n>_BLx, which may be transmitted through the global input/output lines GIO0~GIOn coupled to the bit line, based on a number of the data having a specific logic level. For example, when the number of the data having the specific logic level is no less than half of total number of the data GIO<0:n>_BLx transmitted through the global input/output lines GIO0~GIOn coupled to the bit line, the preliminary DBI flag signal DBI_BLx_PRE may be enabled. When the number of the data having the specific logic level is substantially the same as the total number of the data GIO<0:n>_BLx transmitted through the global input/output lines GIO0~GIOn coupled to the bit line or the number of the data having the specific logic level is zero, the preliminary duplicate data flag signal DQO_COPY_BLx may be enabled. When the enablement condition of the preliminary DBI flag signal DBI_BLx_PRE and the enablement condition of the preliminary duplicate data flag signal DQO_COPY_BLx is satisfied, the preliminary DBI flag signal DBI_BLx_PRE and the preliminary duplicate data flag signal DQO_COPY_BLx may be enabled.

In an example of an embodiment, when the number of the data having a high or low level among the data GIO<0:n> transmitted through the global input/output lines GIO0~GIOn coupled to the zeroth bit line BL0 is no less than [(n+1)/2+1], the preliminary DBI flag signal DBI_BL0_PRE may be enabled to a high level. When the number of the data having a high or low level among the data GIO<0:n> transmitted through the global input/output lines GIO0~GIOn coupled to the zeroth bit line BL0 is (n+1) or zero, the preliminary duplicate data flag signal DQO_COPY_BL0 may be enabled to a high level.

FIG. 5 is a block diagram illustrating a preliminary signal-generating circuit in accordance with an example of embodiment.

Referring to FIGS. 4 and 5, the preliminary flag-generating circuit 1220 may generate the preliminary flag signals DBI_BLx_PRE and DQO_COPY_BLx in accordance with the number of the specific logic levels in the data transmitted through the same bit line.

The flag-generating circuit 1230, also known herein as a bit line flag-generating circuit, may include a first flag-generating circuit 1231 and a second flag-generating circuit 1233.

The first flag-generating circuit 1231 may receive at least one of the preliminary DBI flag signal DBI_BLx_PRE, for example, the preliminary DBI flag signal DBI_BL0_PRE with respect to the zeroth bit line and the preliminary duplicate data flag signals DQO_COPY_BL0~DQO_COPY_BLm outputted from the preliminary signal-generating circuits 1220-0~1220-m. The first flag-generating circuit 1231 may generate a first flag signal DBI_BL0 in response to the duplicate data output-enabling signal DQO_COPY_EN.

Figure 7:
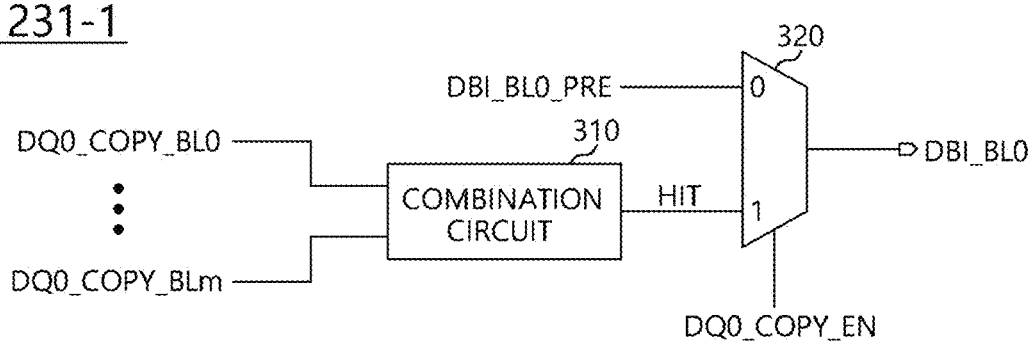
FIG. 7 is a block diagram illustrating a first flag-generating circuit in accordance with various examples of embodiments.

In an example of an embodiment, when the duplicate data output function from the (m+1) bit lines are performed, the first flag-generating circuit 1231 may determine an identity of the data by the bit lines by combinations of the preliminary duplicate data flag signals DQO_COPY_BL0~DQO_COPY_BLm with respect to the bit lines outputted from the preliminary signal-generating circuits 1220-0~1220-m to output a hit signal HIT (See FIG. 7).

The first flag-generating circuit 1231 may receive the hit signal HIT as a first input signal and at least one of the preliminary DBI flag signals, for example, DBI_BL0_PRE as a second input signal. When the duplicate data output-enabling signal DQO_COPY_EN is enabled, the first flag-generating circuit 1231 may output the hit signal HIT as the first flag signal DBI_BL0. When the duplicate data output-enabling signal DQO_COPY_EN is disabled, the first flag-generating circuit 1231 may output the at least one preliminary DBI flag signal DBI_BL0_PRE as the first flag signal DBI_BL0.

The second flag-generating circuit 1233 may receive the rest of the preliminary DBI flag signals, for example, DBI_BL1_PRE~DBI_BLm_PRE. The second flag-generating circuit 1233 may generate m bits of a second flag signal DBI_BL1~DBI_BLm in response to the DBI-enabling signal DBI_EN.

In an example of an embodiment, the second flag-generating circuit 1233 may include a plurality of output circuits configured to receive the rest of the preliminary DBI flag signals DBI_BL1_PRE~DBI_BLm_PRE. When the DBI-enabling signal DBI_EN is enabled, each of the output circuits may output the rest of the preliminary DBI flag signals DBI_BL1_PRE~DBI_BLm_PRE as the second flag signals DBI_BL1~DBI_BLm.

Referring to FIGS. 4 and 5, the preliminary flag-generating circuit 1220 may include a plurality of preliminary signal-generating circuits 1220-0~1220-m. The preliminary signal-generating circuits 1220-0~1220-m may have substantially the same configuration.

For example, a preliminary signal-generating circuit 1220-x may include a plurality of first arithmetic circuits 210-1~210-k, a plurality of second arithmetic circuits 220-1~220-l, and a determining circuit 230.

Each of the first arithmetic circuits 210-1~210-k may receive a pair of the data GIO<0:n> transmitted through the global input/output lines. Each of the first arithmetic circuits 210-1~210-k may generate output signals S0_x, S1_x, and S2_x based on the number of the input data having the specific logic level in response to the flag generation-enabling signal DBI_DQO_COPY_EN.

For example, a first arithmetic circuit#1 210-1 may receive zeroth and first data D0 and D1 among the data GIO<0:n> transmitted through the global input/output lines. The first arithmetic circuit 210-1 may add the zeroth and first data D0 and D1 in response to the flag generation-enabling signal DBI_DQO_COPY_EN (i.e., EN). The first arithmetic circuit#1 210-1 may generate the output signals S0_1, S1_1 and S2_1 representing added results of 0, 1 and 2, respectively.

FIGS. 6A to 6C are block diagrams illustrating operations of a preliminary flag-generating circuit in accordance with an example of an embodiment.

FIG. 6A is a table representing the output signals S0_1, S1_1 and S2_1 in accordance with the input data D0 and D1 of the first arithmetic circuit 210-1.

When the flag generating-enabling signal DBI_DQO_COPY_EN; EN) is disabled, all of the output signals S0_1, S1_1 and S2_1 may be disabled.

When the flag generating-enabling signal DBI_DQO_COPY_EN; EN) is enabled, levels of the output signals S0_1, S1_1 and S2_1 may be determined in accordance with added results of the input data D0 and D1. For example, when the added result is 0 S0_1 may be outputted to a high level. When the added result is 1, S1_1 may be outputted to a high level. When the added result is 2, S2_1 may be outputted to a high level.

Operations of other first arithmetic circuits 210-2~210-k may be substantially the same as those of the first arithmetic circuit#1 210-1.

Thus, the output signals S0_x, S1_x and S2_x of the first arithmetic circuits 210-1~210-k may include the pair of the data GIO<0:n> transmitted through the global input/output lines. As a result, the number of the data having the specific logic level may be recognized from the output signals S0_x, S1_x and S2_x of the first arithmetic circuits 210-1~210-k.

The second arithmetic circuits 220-1~220-l may receive the output signals [S0_(x-1), S1_(x-1) and S2_(x-1)] and [S0_x, S1_x and S2_x] of the pair of the first arithmetic circuits 210-(x-1) and 210-x. The second arithmetic circuit 220-1~220-l may generate the output signals SO0_x, SO1_x, SO2_x and SO3_x representing added results of 0, 1, 2 and 3, respectively.

FIG. 6B is a table representing the output signals SO0_1, SO1_1, SO2_1 and SO3_1 in accordance with the input data (SO_1, S1_1 and S2_1) and (S0_2, S1_2 and S2_2) of the second arithmetic circuit#1 220-1.

When the flag generating-enabling signal DBI_DQO_COPY_EN; EN) is disabled, all of the output signals S0_1, S1_1 and S2_1 may be disabled.

When an added result of the input data is 0, the output signal S0_1 of the first arithmetic circuit#1 210-1 and the output signal S0_2 of the first arithmetic circuit#2 210-2 may be outputted to a high level. When an added result of the input data is 1, the output signal S1_1 of the first arithmetic circuit#1 210-1 and the output signal S1_2 of the first arithmetic circuit#2 210-2 may be outputted to a high level. When an added result of the input data is 2, the output signal S2_1 of the first arithmetic circuit#1 210-1 and the output signal S2_2 of the first arithmetic circuit#2 210-2 may be outputted to a high level.

The second arithmetic circuit#1 220-1 may add the input data (S0_1, S1_1 and S2_1) and (S0_2, S1_2 and S2_2) to generate the output signals SO0_1, SO1_1, SO2_1 and SO3_1

For example, when the added result of the input data (S0_1, S1_1 and S2_1) and (S0_2, S1_2 and S2_2) is 0, the second arithmetic circuit#1 220-1 may output SO0_1 to a logic high level. When the added result of the input data (S0_1, S1_1 and S2_1) and (S0_2, S1_2 and S2_2) is 1, the second arithmetic circuit#1 220-1 may output SO1_1 to a logic high level. When the added result of the input data (S0_1, S1_1 and S2_1) and (S0_2, S1_2 and S2_2) is 2, the second arithmetic circuit#1 220-1 may output SO2_1 to a logic high level. When the added result of the input data (S0_1, S1_1 and S2_1) and (S0_2, S1_2 and S2_2) is 3, the second arithmetic circuit#1 220-1 may output SO2_1 and SO1_1 to a logic high level. When the added result of the input data (S0_1, S1_1 and S2_1) and (S0_2, S1_2 and S2_2) is 4, the second arithmetic circuit#1 220-1 may output SO3_1 to a logic high level.

Operations of other second arithmetic circuits 220-2~220-l may be substantially the same as those of the second arithmetic circuit#1 220-1.

Thus, the output signals SO0_x, SO1_x, SO2_x and SO3_x of the second arithmetic circuits 220-1~220-l may include the pair of the data S0_x, S1_x and S2_x outputted from the first arithmetic circuits 210-1~210-k. As a result, the number of the data having the specific logic level may be recognized from the output signals SO0_x, SO1_x, SO2_x and SO3_x of the second arithmetic circuits 220-1~220-l.

In an example of an embodiment, the first arithmetic circuits 210-1~210-k and the second arithmetic circuits 220-1~220-l may include an adding circuit. Alternatively, the first arithmetic circuits 210-1~210-k and the second arithmetic circuits 220-1~220-l may include other circuits.

Referring to FIG. 5, the determining circuit 230 may receive the output signals of the second arithmetic circuits 220-1~220-l to generate the preliminary flag signals DBI_BLx_PRE and DQO_COPY_BLx.

In an example of an embodiment, when the number of the data having a predetermined logic level is no less than half of the total number of the data, the determining circuit 230 may enable the preliminary DBI flag signal DBI_BLx_PRE based on logic levels of the output signals from the pair of the second arithmetic circuits 220-1~220-l. When the number of the data having the predetermined logic level is 0 or (n+1), the determining circuit 230 may enable the preliminary duplicate data flag signal DQO_COPY_BLx.

Referring to FIG. 6C, the output signals SO3_1, SO2_1, SO1_1 and SO0_1 of the second arithmetic circuit 220-1 may indicate the disablement state (0000) and the added results of 0(0001), 1(0010), 2(0100), 3(0110) and 4(1000). Similarly, the output signals SO3_2, SO2_2, SO1_2 and SO0_1 of the second arithmetic circuit 220-2 may indicate the disablement state (0000) and the added results of 0(0001), 1(0010), 2(0100), 3(0110) and 4(1000).

Therefore, when the number of the data having the predetermined logic level is no less than 5, the determining circuit 230 may enable the preliminary DBI flag signal DBI_BLx_PRE. When the number of the data having the predetermined logic level is 0 or 8, the determining circuit 230 may enable the preliminary duplicate data flag signal DQO_COPY_BLx.

FIG. 7 is a block diagram illustrating a first flag-generating circuit in accordance with an example of an embodiment.

Referring to FIG. 7, the first flag-generating circuit 1231-1 may include a combination circuit 310 and an output circuit 320.

The combination circuit 310 may determine an identity of the data from the bit lines by the combination of the preliminary duplicate data flag signal DQO_COPY_BL0~DQO_COPY_BLm outputted from the preliminary signal-generating circuits 1220-0~1220-m to generate the hit signal HIT.

In an example of an embodiment, when the preliminary duplicate data flag signals DQO_COPY_BL0~DQO_COPY_BLm have a high level, the combination circuit 310 may generate the hit signal HIT to a high level.

The output circuit 320 may receive at least one of the preliminary DBI flag signals DBI_BL0_PRE and the hit signal HIT outputted from the combination circuit 310. The output circuit 320 may output any one of the two input signals as the first flag signal DBI_BL0 in response to the duplicate data output-enabling signal DQO_COPY_EN.

In an example of an embodiment, when the duplicate data output-enabling signal DQO_COPY_EN is enabled, the output circuit 320 may output the hit signal HIT outputted from the combination circuit 310 as the first flag signal DBI_BL0. When the duplicate data output-enabling signal DQO_COPY_EN is disabled and the DBI-enabling signal DBI_EN is enabled, the output circuit 320 may output at least one of the preliminary DBI flag signals DBI_BL0_PRE as the first flag signal DBI_BL0.

In an example of an embodiment, the output circuit 320 may include a multiplexer circuit. Alternatively, the output circuit 320 may include other circuits.

Figure 8:
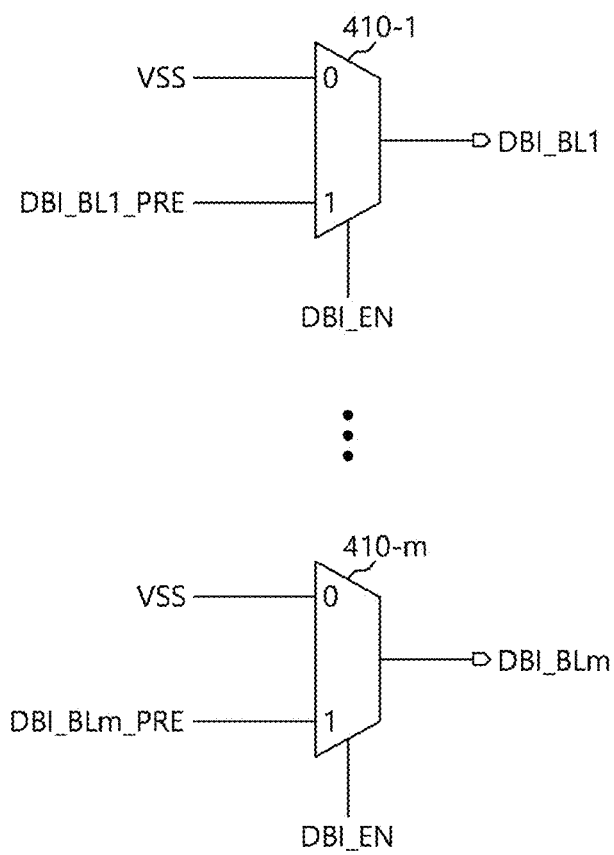
FIG. 8 is a block diagram illustrating a second flag-generating circuit in accordance with various examples of embodiments.

FIG. 8 is a block diagram illustrating a second flag-generating circuit in accordance with an example of an embodiment.

Referring to FIG. 8, the second flag-generating circuit 1233-1 may include a plurality of output circuits 410-1~410-m.

Each of the output circuits 410-1~410-m may receive the rest of the preliminary DBI flag signals DBI_BL1_PRE~DBI_BLm_PRE. Each of the output circuits 410-1 to 410-m may receive a ground voltage VSS. When the DBI-enabling signal DBI_EN is enabled, the output circuits 410-1~410-m may output the input signals as the second flag signals DBI_BL1~DBI_BLm.

When the DBI-enabling signal DBI_EN is disabled, the second flag signals DBI_BL1~DBI_BLm may have a ground voltage level so that the second flag signals DBI_BL1~DBI_BLm may be disabled.

In an example of an embodiment, the output circuits 410-1~410-m may include a multiplexer circuit. Alternatively, the output circuits 410-1~410-m may include other circuits.

Figure 9:
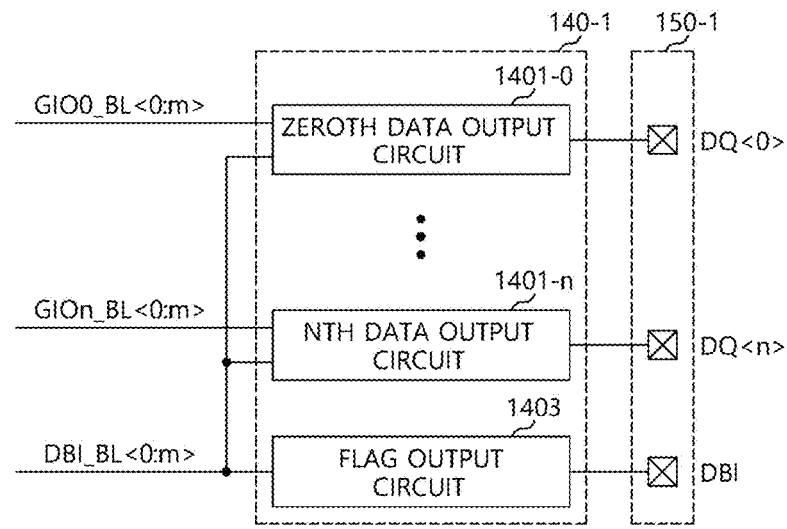
FIG. 9 is a block diagram illustrating an output circuit and a pad group in accordance with various examples of embodiments.

FIG. 9 is a block diagram illustrating an output circuit and a pad group in accordance with an example of an embodiment.

Referring to FIG. 9, the output circuit 140-1 may include a plurality of data output circuits 1401-0~1401-n and a flag output circuit 1403.

The data output circuits 1401-0~1401-n may receive the data GIO0_BL<0:m>~GIOn_BL<0:m> transmitted through the global input/output lines GIO0~GIOn. The data output circuits 1401-0~1401-n may code the data GIO0_BL<0:m>~GIOn_BL<0:m> in accordance with the flag signals DBI_BL<0:m> for each of the bit lines. The data output circuits 1401-0~1401-n may sequentially output the coded data.

The flag output circuit 1403 may receive the flag signals DBI_BL<0:m> for each of the bit lines. The flag output circuit 1403 may sequentially output the received flag signals DBI_BL<0:m>.

The pad groups 150-1 may include a plurality of data pads DQ<0>~DQ<n> and a flag pad DBI. The data pads DQ<0>~DQ<n> may output the data provided from the data output circuits 1401-0~1401-n. The flag pad DBI may output the flag signals DBI_BL<0:m> for each of the bit lines provided from the flag output circuit 1403.

The data output circuits 1401-0~1401-n in FIG. 9 may have substantially the same configuration.

Figure 10:
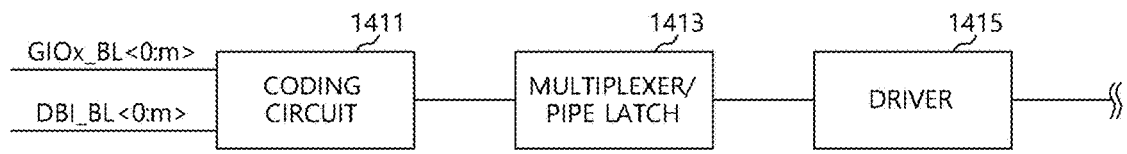
FIG. 10 is a block diagram illustrating a data-outputting circuit in accordance with various examples of embodiments.

FIG. 10 is a block diagram illustrating a data-outputting circuit in accordance with an example of an embodiment.

Referring to FIG. 10, the data output circuit 1401-x may include a coding circuit 1411, a multiplexer and pipe (multiplexer/pipe) latch 1413, and a driver 1415.

The coding circuit 1411 may code the data GIOx_BL<0:m> transmitted through the global input/output lines GIO0~GIOn in response to the flag signals DBI_BL<0:m> for each of the bit lines. In an example of an embodiment, when the flag signals DBI_BL<0:m> for each of the bit lines are disabled, the coding circuit 1411 may output the data GIOx_BL<0:m>. When the flag signals DBI_BL<0:m>for each of the bit lines are the DBI flag signals for each of the bit lines, the coding circuit 1411 may output the inversed or non-inversed data GIOx_BL<0:m> based on the DBI flag signal for each of the bit lines.

When any one of the flag signals DBI_BL<0:m>, for example, the flag signal DBI_BL0 with respect to the zeroth bit line include the duplicate data flag signal, the operation of the coding circuit 1411 may be determined based on the level of the duplicate data flag signal. For example, when the duplicate data flag signal is enabled, only one of the data output circuits 1401-0~1401-n, for example, only the coding circuit of only the data output circuit 1401-0 may output the data. In contrast, the rest coding circuit of the rest of the data output circuits 1401-1~1401-n may not output the data.

When the flag signals DBI_BL<0:m> for each of the bit lines include the DBI flag signals for each of the bit lines as well as the duplicate data flag signal, the coding circuit 1411 may output the inversed or non-inversed data GIOx_BL<0:m> based on the rest of the DBI flag signals DBI<1:m> for each of the bit lines.

The multiplexer/pipe latch 1413 may sequentially output the data from coding circuit 1411.

The driver 1415 may amplify the data outputted from the multiplexer/pipe latch 1413. The driver 1415 may transmit the amplified data to the pad group 150.

Figure 11:
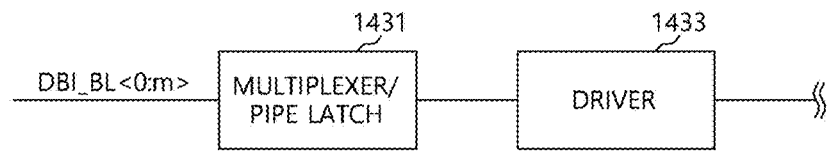
FIG. 11 is a block diagram illustrating a flag-outputting circuit in accordance with various examples of embodiments.

FIG. 11 is a block diagram illustrating a flag-outputting circuit in accordance with an example of an embodiment.

Referring to FIG. 11, the flag output circuit 1403 may include a multiplexer/pipe latch 1431 and a driver 1433.

The multiplexer/pipe latch 1431 may sequentially output the flag signals DBI_BL<0:m>.

The driver 1433 may amplify the flag signals DBI_BL<0:m> outputted from the multiplexer/pipe latch 1431. The driver 1433 may transmit the amplified data to the pad group 150.

Figure 12:
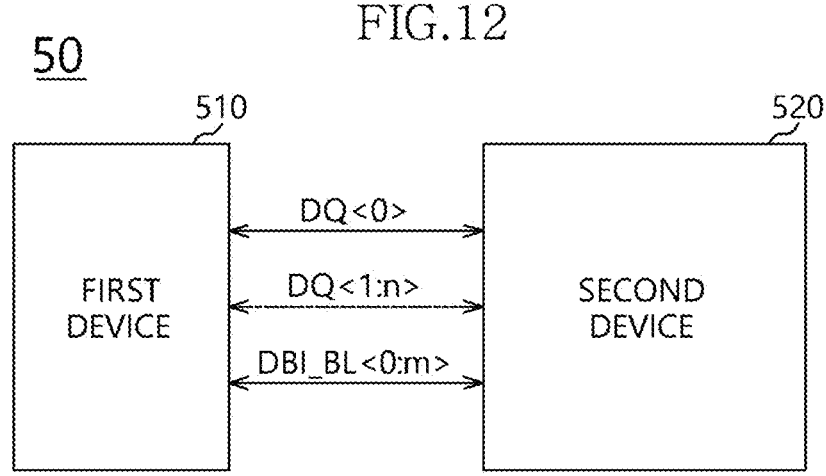
FIG. 12 is a block diagram illustrating an electronic system in accordance with various examples of embodiments.

FIG. 12 is a block diagram illustrating an electronic system in accordance with an example of an embodiment.

Referring to FIG. 12, the electronic system 50 may include a first device 510 and a second device 520.

The first device 510 may include a receiver. The second device 520 may include a transmitter and a semiconductor device such as the semiconductor memory device in FIG. 1.

The flag signals DBI_BL<0:m> for each of the bit lines and the data DQ<0:n> may be transmitted between the first device 510 and the second device 520.

When the flag signals DBI_BL<0:m> for each of the bit lines is include the DBI flag signal for each of the bit lines, the second device 520 may perform an encoding operation for inverting or non-inverting the data DQ<0:n> in accordance with the flag signals DBI_BL<0:m>. The second device 520 may transmit the encoded data to the first device 510. The first device 510 may decode the data DQ<0:n> in accordance with the flag signals DBI_BL<0:m> for each of the bit lines.

At least one of the flag signals DBI_BL<0:m> for each of the bit lines may include the duplicate data flag signal. When the duplicate data flag signal is enabled, the second device 520 may transmit only one data DQ<0> to the first device 510. The first device 510 may copy the received data DQ<0> with the rest of the data DQ<1:n> in accordance with the flag signals DBI_BL<0:m>. When the duplicate data flag signal is disable, the second device 520 may transmit all of the data DQ<0:n> to the first device 510. The first device 510 may copy or receive the received data DQ<0> with the rest of the data DQ<1:n> in accordance with the flag signals DBI_BL<0:m>.

At least one of the flag signals DBI_BL<0:m> for each of the bit lines may include the duplicate data flag signal and the rest of the flag signals DBI_BL<1:m> may include the DBI flag signals with respect to the rest of the bit lines. The second device 520 may transmit only one data DQ<0> or all of the data DQ<0:n> to the first device 510 in accordance with an enablement of the duplicate data flag signal. The second device 520 may perform an encoding operation for inverting or non-inverting the data DQ<0:n> in accordance with the flag signals DBI_BL<1:m> from the rest of the bit lines. The second device 520 may transmit the encoded data to the first device 510. The first device 510 may copy the received data DQ<0> with the rest of the data DQ<1:n> or all of the data DQ<0:n> in accordance with the flag signals DBI_BL<0:m>. The first device may decode the data DQ<0:n> in accordance with the flag signals DBI_BL<0:m> for each of the bit lines.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:
1. A semiconductor memory device comprising:
   a memory circuit including a plurality of memory cells coupled between a plurality of word lines and a plurality of bit lines, the memory circuit configured to output data from the memory cells coupled to the bit lines through a global input and output (input/output) line;
   a flag-generating circuit configured to generate flag signals based on a number of data having a specific logic level among the data in the memory cells for each of the bit lines and provided through the global input/output line in a read operation, the flag signals including at least one of a duplicate data flag signal and a data bus inversion flag signal; and
   an output circuit configured to output the data in the memory cells provided through the global input/output line based on at least one of the duplicate data flag signal and the data bus inversion flag signal.

2. The semiconductor memory device of claim 1, further comprising:
a mode register configured to provide a duplicate data output-enabling signal and a data bus inversion-enabling signal,
wherein the flag-generating circuit is configured to generate at least one bit among the flag signals for each of the bit lines as the duplicate data flag signal based on the duplicate data output-enabling signal being enabled and the data bus inversion-enabling signal being disabled.

3. The semiconductor memory device of claim 1, further comprising:
a mode register configured to provide a duplicate data output-enabling signal and a data bus inversion-enabling signal,
wherein the flag-generating circuit is configured to output the flag signals for each of the bit lines as the data bus inversion flag signal for each of the bit lines based on the duplicate data output-enabling signal being disabled and the data bus inversion-enabling signal being enabled.

4. The semiconductor memory device of claim 1, further comprising:
a mode register configured to provide a duplicate data output-enabling signal and a data bus inversion-enabling signal,
wherein the flag-generating circuit is configured to output at least one bit among the flag signals for each of the bit lines as the duplicate data flag signal and to output the rest of the bits of the flag signals for each of the bit lines as the data bus inversion flag signal for each of the bit lines based on the duplicate data output-enabling signal being enabled and the data bus inversion-enabling signal being enabled.

5. The semiconductor memory device of claim 1, wherein the flag-generating circuit comprises:
a preliminary flag-generating circuit configured to generate preliminary flag signals based on the number of the data having the specific logic level by receiving the data in the memory cells from the bit lines, in response to a flag generation-enabling signal generated based on a duplicate data output-enabling signal and a data bus inversion-enabling signal; and
a bit line flag-generating circuit configured to generate the flag signals for each of the bit lines from the preliminary flag signals for each of the bit lines, based on the duplicate data output-enabling signal and the data bus inversion-enabling signal.

6. The semiconductor memory device of claim 5, wherein the preliminary flag-generating circuit comprises a plurality of preliminary signal-generating circuits coupled to the bit lines, and each of the preliminary signal-generating circuits is configured to add the data in the memory cells coupled to the bit lines to generate preliminary data bus inversion flag signals and preliminary duplicate data flag signals.

7. The semiconductor memory device of claim 5, wherein the preliminary flag-generating circuit comprises a plurality of preliminary signal-generating circuits coupled to the bit lines,
each of the preliminary signal-generating circuits comprises:
at least one first arithmetic circuit configured to receive and add a pair of the data from the memory cells coupled to the bit lines in response to the flag generation-enabling signal;
at least one second arithmetic circuit configured to receive and add output signals from a pair of the first arithmetic circuits; and
a determining circuit configured to generate preliminary data bus inversion flag signals and preliminary duplicate data flag signals from output signals of the second arithmetic circuits.

8. The semiconductor memory device of claim 5, wherein the preliminary flag signals comprise preliminary data bus inversion flag signals received with respect to the bit lines and preliminary duplicate data flag signals received with respect to the bit lines,
the bit line flag-generating circuit comprises:
a first flag-generating circuit configured to generate a first flag signal based on at least one of the preliminary data bus inversion flag signals received with respect to the bit lines and the preliminary duplicate data flag signals received with respect to the bit lines; and
a second flag-generating circuit configured to generate a second flag signal based on the rest of the preliminary data bus inversion flag signals received with respect to the bit lines.

9. The semiconductor memory device of claim 8, wherein the first flag-generating circuit comprises:
a combination circuit configured to generate a hit signal based on levels of the preliminary duplicate data flag signals received with respect to the bit lines; and
an output circuit configured to generate any one of the at least one of the preliminary data bus inversion flag signals and the hit signal as the first flag signal in response to the duplicate data output-enabling signal.

10. The semiconductor memory device of claim 8, wherein the second flag-generating circuit comprises a plurality of output circuits configured to generate the rest of the preliminary data bus inversion flag signals as the second flag signal based on the data bus inversion-enabling signal.

11. A flag generating circuit for generating a flag signal, the flag generating circuit comprising:
a preliminary flag-generating circuit configured to receive data from memory cells through bit lines provided through a global input and output (input/output) line and configured to add the data from the memory cells based on a duplicate data output-enabling signal and a data bus inversion-enabling signal to generate preliminary flag signals received with respect to the bit lines; and
a bit line flag-generating circuit configured to generate flag signals for each of the bit lines from the preliminary flag signals for each of the bit lines, in response to the duplicate data output-enabling signal and the data bus inversion-enabling signal,
wherein the flag signals for each of the bit lines including at least one of the duplicate data flag signal and the data bus inversion flag signal.

12. The circuit of claim 11, wherein the preliminary flag-generating circuit comprises a plurality of preliminary signal-generating circuits coupled to the bit lines,
each of the preliminary signal-generating circuits comprises:
at least one first arithmetic circuit configured to receive and add a pair of the data from the memory cells coupled to the bit lines in response to a duplicate data output-enabling signal and data bus inversion-enabling signal;

at least one second arithmetic circuit configured to receive and add output signals from a pair of the first arithmetic circuits; and a determining circuit configured to generate preliminary data bus inversion flag signals and preliminary duplicate data flag signals from output signals of the second arithmetic circuits.

13. The circuit of claim 11, wherein the preliminary flag signals comprise preliminary data bus inversion flag signals received with respect to the bit lines and preliminary duplicate data flag signals received with respect to the bit lines, the bit line flag-generating circuit comprises:

a first flag-generating circuit configured to generate a first flag signal based on at least one of the preliminary data bus inversion flag signals received with respect to the bit lines and the preliminary duplicate data flag signals received with respect to the bit lines; and a second flag-generating circuit configured to generate a second flag signal based on the rest of the preliminary data bus inversion flag signals received with respect to the bit lines.

14. The circuit of claim 13, wherein the first flag-generating circuit comprises:

a combination circuit configured to generate a hit signal based on levels of the preliminary duplicate data flag signals received with respect of the bit lines; and an output circuit configured to generate any one of the at least one of the preliminary data bus inversion flag signals and the hit signal as the first flag signal in response to the duplicate data output-enabling signal.

15. The circuit of claim 13, wherein the second flag-generating circuit comprises a plurality of output circuits configured to generate the rest of the preliminary data bus inversion flag signals as the second flag signal based on the data bus inversion-enabling signal.

16. A method of outputting data in semiconductor memory device, the semiconductor memory device including a memory circuit including a plurality of memory cells coupled between a plurality of word lines and a plurality of bit lines, the memory circuit configured to output data from the memory cells coupled to the bit lines through a global input and output (input/output) line, the method comprising:

generating flag signals with respect to the bit lines based on a number of data having a specific logic level among the data in the memory cells for each of the bit lines provided through the global input/output line, the flag signals received with respect to the bit lines including at least one of a duplicate data flag signal and a data bus inversion flag signal; and outputting the data in the memory cells provided through the global input/output line in response to at least one of the duplicate data flag signal and the data bus inversion flag signal.

17. The method of claim 16, wherein generating the flag signals comprises outputting at least one bit of the flag signals received with respect to the bit lines as the duplicate data flag signals when a duplicate data output-enabling signal from a mode register is enabled and a data bus inversion-enabling signal from the mode register is disabled.

18. The method of claim 16, wherein generating the flag signals comprises outputting the flag signals received with respect to the bit lines as data bus inversion flag signals received with respect to the bit lines when a duplicate data output-enabling signal from a mode register is disabled and a data bus inversion-enabling signal from the mode register is enabled.

19. The method of claim 16, wherein generating the flag signals comprises outputting at least one bit of the flag signals for each of the bit lines as the duplicate data flag signals and outputting the rest of the bits of the flag signals for each of the bit lines as data bus inversion flag signals when a duplicate data output-enabling signal and a data bus inversion-enabling signal from the mode register is enabled.

20. The method of claim 16, wherein generating the flag signals comprises:

adding the data in the memory cells from the bit lines provided through the global input/output line to generate preliminary data bus inversion flag signals and preliminary duplicate data flag signals;

generating a first flag signal in response to at least one of the preliminary data bus inversion flag signals and the preliminary duplicate data flag signals; and generating a second flag signal in response to the rest of the preliminary data bus inversion flag signals.

* * * * *